(12) United States Patent
Itou

(10) Patent No.: US 7,259,073 B2
(45) Date of Patent: Aug. 21, 2007

(54) SEMICONDUCTOR DEVICE AND METHOD OF MANUFACTURING THE SAME

(75) Inventor: Masayuki Itou, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 69 days.

(21) Appl. No.: 10/983,672

(22) Filed: Nov. 9, 2004

(65) Prior Publication Data

US 2005/0101074 A1    May 12, 2005

(30) Foreign Application Priority Data

Nov. 10, 2003  (JP)  ............................. 2003-379835

(51) Int. Cl.
  *H01L 21/336*  (2006.01)
  *H01L 21/8234*  (2006.01)

(52) U.S. Cl. ................ 438/296; 438/197; 257/E21.545

(58) Field of Classification Search ................ 438/296, 438/241, 424; 257/E21.546, E21.545, E21.551, 257/E21.549
See application file for complete search history.

(56) References Cited

U.S. PATENT DOCUMENTS

| | | | | |
|---|---|---|---|---|
| 4,356,211 A | * | 10/1982 | Riseman | ..................... 438/422 |
| 4,926,235 A | | 5/1990 | Tamaki et al. | |
| 5,751,040 A | * | 5/1998 | Chen et al. | ................... 257/332 |
| 5,763,315 A | * | 6/1998 | Benedict et al. | ............. 438/424 |
| 5,773,871 A | | 6/1998 | Boyd et al. | |
| 5,868,870 A | * | 2/1999 | Fazan et al. | ................ 148/33.3 |
| 5,925,894 A | * | 7/1999 | Yang | ............................ 257/66 |
| 6,037,018 A | * | 3/2000 | Jang et al. | ................... 427/579 |
| 6,165,843 A | * | 12/2000 | Sung | ............................ 438/258 |
| 6,387,770 B2 | * | 5/2002 | Roy | ............................ 438/384 |
| 6,544,861 B2 | * | 4/2003 | Joo | ............................ 438/424 |
| 6,559,029 B2 | * | 5/2003 | Hur | ............................ 438/427 |
| 6,645,795 B2 | * | 11/2003 | Muller et al. | ............... 438/149 |
| 6,653,203 B1 | * | 11/2003 | Huang et al. | ............... 438/435 |
| 6,750,117 B1 | * | 6/2004 | Hung et al. | ................. 438/437 |
| 6,774,007 B2 | * | 8/2004 | Liu et al. | .................... 438/424 |
| 6,790,732 B2 | * | 9/2004 | Zahurak et al. | ............. 438/283 |
| 6,864,152 B1 | * | 3/2005 | Mirbedini et al. | .......... 438/427 |
| 6,897,516 B2 | * | 5/2005 | Mehrad et al. | ............. 257/315 |
| 7,196,396 B2 | * | 3/2007 | Ohta | ............................ 257/510 |
| 2001/0044188 A1 | * | 11/2001 | Heo et al. | .................. 438/268 |
| 2003/0054630 A1 | * | 3/2003 | Kirchhoff | ................... 438/624 |

FOREIGN PATENT DOCUMENTS

| | | |
|---|---|---|
| EP | 0 272 491 A2 | 6/1988 |
| EP | 0 928 023 A1 | 7/1999 |
| JP | 2002-237518 A | 8/2002 |

* cited by examiner

*Primary Examiner*—Walter Lindsay, Jr.
*Assistant Examiner*—Thu-Huong Dinh
(74) *Attorney, Agent, or Firm*—Sughrue Mion, PLLC

(57) ABSTRACT

A method of manufacturing a semiconductor device that suppresses emergence of a waste in an isolation trench formation process is to be provided.

The method comprises forming an isolation trench having a predetermined depth from a surface of a semiconductor substrate; forming a dielectric layer on the surface of the semiconductor substrate including the isolation trench; filling the isolation trench with a CVD layer; removing the dielectric layer except a portion in the isolation trench by an etching; sequentially forming an insulating layer and a conductive layer; forming a resist defining a pattern which covers via the conductive layer a portion of the insulating layer in contact with the dielectric layer; and performing an anisotropic etching on the resist to thereby remove a portion of the conductive layer exposing a surface thereof.

10 Claims, 8 Drawing Sheets

PRIOR ART

PRIOR ART

SEMICONDUCTOR DEVICE AND METHOD OF MANUFACTURING THE SAME

This application is based on Japanese patent application No. 2003-379835, the content of which is incorporated hereinto by reference.

BACKGROUND OF THE INVENTION

1. Field of the Invention

The present invention relates to a semiconductor device and a method of manufacturing the same.

2. Description of the Related Art

A semiconductor device is provided with circuit elements such as a transistor, a resistance, a condenser and the like disposed on a semiconductor substrate, and the circuit elements are connected to one another via an interconnect for executing an instructed circuit operation, to thereby perform a function as required. The circuit elements have to be electrically insulated in order to effectively perform the circuit operation and function. Accordingly, various insulating and isolating techniques have been proposed, such as a trench isolation technique of filling a layer in a trench formed on a semiconductor substrate. A conventional example of a method of manufacturing a semiconductor device utilizing a trench isolation technique is described hereunder.

FIGS. 7A to 8C are schematic cross-sectional views showing a conventional method of manufacturing a semiconductor device.

Referring to FIG. 7A, a mask oxide layer 2 having an opening of 0.5 to 2 μm in width is formed in a thickness of 100 to 600 nm on a silicon substrate 1. Then an anisotropic etching is performed on the silicon substrate 1 utilizing the mask oxide layer 2 as an etching mask, so that a trench 3 of 1 to 5 μm in depth is formed on the silicon substrate 1. The trench 3 is to serve as an isolation trench.

Referring to FIG. 7B, the mask oxide layer 2 is removed, and a silicon oxide layer is formed in a thickness of 100 to 800 nm over a surface of the silicon substrate 1 and the trench 3 by a thermal oxidation process. This silicon oxide layer serves as a dielectric layer 4. Then a polycrystalline silicon layer is formed in a thickness of 150 to 1500 nm on the dielectric layer 4, for example by a CVD (Chemical Vapor Deposition) process, so that the trench 3 is filled with the polycrystalline silicon layer, to thereby constitute a trench isolation region 33. Here, the polycrystalline silicon layer that is filled in the trench 3 will be herein referred to as a filling polycrystalline silicon layer 5. Also, a layer formed by a CVD process will be herein referred to as a CVD layer.

Then as shown in FIG. 7C, an etch-back or a CMP (Chemical and Mechanical Polishing) process is performed so as to remove the filling polycrystalline silicon layer 5 except a portion formed in the trench isolation region 33.

Referring to FIG. 8A, a wet etching is performed so as to remove the dielectric layer 4 except a portion formed in the trench 3. Then as shown in FIG. 8B, a gate insulating layer 6 of a transistor is formed in a thickness of 3 to 30 nm on a surface of the silicon substrate 1 and the trench isolation region 33 by a CVD process, and a polycrystalline silicon layer is formed thereon in a thickness of 100 to 600 nm by a CVD process. In order to form a gate electrode, a conductive impurity is diffused in the polycrystalline silicon layer, so as to constitute an impurity-diffused polycrystalline silicon layer 7. Also, a resist defining a gate electrode pattern 14 is formed by a known lithography technique, after which an anisotropic etching is performed to form a gate electrode 8 constituted of the impurity-diffused polycrystalline silicon layer 7, and then the resist is removed as shown in FIG. 8C.

Also, JP-A Laid Open No. 2002-237518 and others disclose a method of reducing a recess formed in the trench isolation region.

With a conventional trench isolation technique, the etching for removing the dielectric layer 4 often overpasses a surface of the silicon substrate 1 and the filling polycrystalline silicon layer 5 in the wet etching performed in the process according to FIG. 8A. For this reason a gap A is prone to be formed between the dielectric layer 4 and the surface of the silicon substrate 1, and likewise a gap B is prone to be formed between the dielectric layer 4 and the filling polycrystalline silicon layer 5.

Accordingly, even though the gate insulating layer 6 is formed as described referring to FIG. 8B, the gate insulating layer 6 does not fill an entire portion of the trench between the gap A and the gap B, but instead forms a uniform layer along a shape of the gaps, thereby preserving a recessed shape of the trench. Therefore, though the anisotropic etching is performed to remove the impurity-diffused polycrystalline silicon layer 7, a sufficient etching effect cannot be achieved in the proximity of a bottom portion of the trench, which is coated with the gate insulating layer 6, and resultantly an etching residue 9 of the impurity-diffused polycrystalline silicon layer 7 often remains unremoved.

During a process from the etching for forming the gate electrode to the formation of an interlayer dielectric layer on the gate electrode, the etching residue 9 may be peeled off and freely float in a solution, for example in a cleaning process, to later stick to a surface of silicon substrate 1 as a waste. And such waste stuck to the surface of the silicon substrate 1 is prone to cause an abnormality in a characteristic of a semiconductor device, to thereby degrade reliability of the device. Also, a waste floating in a solution of a cleaning device may also stick to a surface of another silicon substrate, while the cleaning device is processing that silicon substrate. Further, the etching residue 9 may also freely float in the device because of a heat treatment, a CVD process or an ion implantation process, in addition to the cleaning process.

On the other hand, a technique disclosed in JP-A Laid Open No. 2002-237518 permits reducing a size of a recess formed in a trench isolation region, however cannot completely eliminate the recess, and therefore has not reached a solution of the problem of the waste from the etching residue. Besides, the problem of the waste from the etching residue may still be incurred even when the recess or the gap is very small.

SUMMARY OF THE INVENTION

The present invention has recognized in view of the foregoing problem, and there is provided a technique through which reliability of a semiconductor device can be upgraded.

According to the present invention, there is provided a semiconductor device comprising a semiconductor substrate; an isolation trench formed inside the semiconductor substrate; a first layer formed along an inner wall of the isolation trench so as to constitute a lining; a second layer formed in contact with an inner surface of the first layer so as to fill the isolation trench; and a conductive layer selectively formed on the isolation trench so as to cover the first layer and the second layer.

According to the present invention, a conductive layer is selectively provided so as to cover the first layer and the second layer. Such structure prevents emergence of an etching residue on second layer. Therefore, reliability of a semiconductor device can be upgraded.

According to the present invention, there is provided a method of manufacturing a semiconductor device comprising forming an isolation trench having a predetermined depth from a surface of a semiconductor substrate; forming a dielectric layer on the surface of the semiconductor substrate including the isolation trench; filling the isolation trench with a CVD layer; removing the dielectric layer except a portion in the isolation trench by an etching; sequentially forming an insulating layer and a conductive layer; forming a resist defining a pattern which covers via the conductive layer a portion of the insulating layer in contact with the dielectric layer; and performing an anisotropic etching on the resist to thereby remove a portion of the conductive layer exposing a surface thereof.

According to the present invention, the pattern covering a portion of the insulating layer in contact with the dielectric layer is constituted of a conductive layer. Accordingly, performing an etching to remove the dielectric layer except a portion in the isolation trench permits suppressing emergence of an etching residue on the insulating layer which is in contact with the dielectric layer, even though a gap is formed between at least either the semiconductor substrate or the CVD layer and the dielectric layer. Therefore, a highly reliable semiconductor device can be stably manufactured.

According to the present invention, there is provided a method of manufacturing a semiconductor device comprising forming an isolation trench on an upper portion of a semiconductor substrate; forming a first layer in contact with an upper surface of the semiconductor substrate including an inner wall of the isolation trench; filling the isolation trench with a second layer; selectively removing the first layer except a portion in the isolation trench; forming an insulating layer so as to cover the first layer, the second layer and an upper surface of the semiconductor substrate; forming a conductive layer so as to cover an upper surface of the insulating layer; forming a resist defining a pattern which covers via the conductive layer a portion of the insulating layer in contact with the second layer and with the first layer; and selectively removing an exposed portion of the conductive layer and forming a gate electrode, and a conductive layer on top of the isolation trench.

According to the present invention, the conductive layer is formed in contact with an upper surface of the insulating layer. Therefore, selectively removing the first layer except a portion in the isolation trench permits preventing emergence of an etching residue of the conductive layer on the insulating layer in contact with the first layer. Consequently, a highly reliable semiconductor device can be stably manufactured.

The method of manufacturing a semiconductor device according to the present invention permits preventing emergence of an etching residue of the conductive layer provided for forming a gate electrode, and therefore contributes to upgrade reliability of a semiconductor device.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 1A:
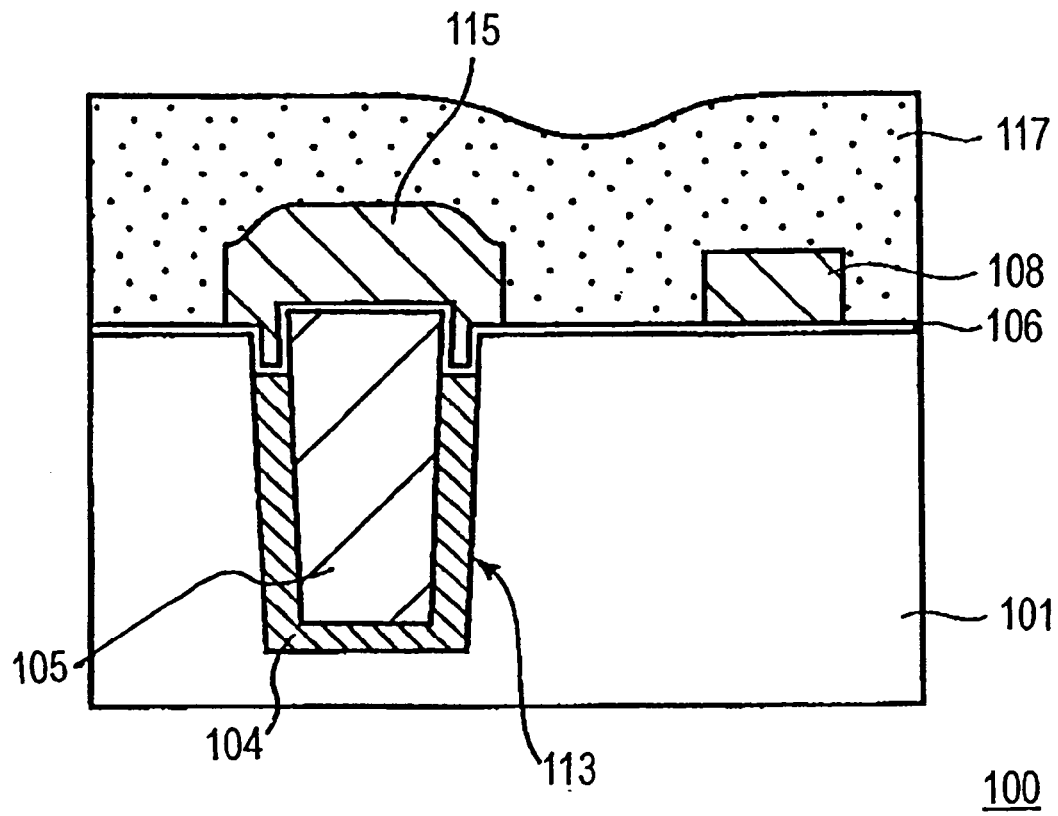
FIGS. 1A and 1B are schematic views showing a constitution of a semiconductor device according to the embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Referring to the accompanying drawings, embodiments of the present invention will be described hereunder. In all the drawings, same constituents are given an identical numeral, and a description thereof may be omitted as the case may be.

A method of manufacturing a semiconductor device according to the present invention is to utilize a conductive layer for forming a gate electrode in constituting a pattern to cover a portion of a trench isolation region where waste is prone to be produced.

Also, in the method of manufacturing a semiconductor device according to the present invention, the resist may be provided with a pattern for forming a gate electrode of a transistor.

According to the present invention, since the resist is provided with a pattern for forming a gate electrode of a transistor, a conductive layer pattern for preventing emergence of an etching residue is formed during a formation process of the gate electrode. This method minimizes the need to add a process to eliminate the gap and a process to remove an etching residue.

Also, in the method of manufacturing a semiconductor device according to the present invention, the resist may cover via the conductive layer a portion of the insulating layer in contact with the CVD layer.

According to the present invention, since the pattern covering a portion of the insulating layer in contact with the CVD layer is constituted of the conductive layer, emergence of an etching residue on the insulating layer in contact with the CVD layer can be prevented.

Also, in the method of manufacturing a semiconductor device according to the present invention, the CVD layer may be a polycrystalline silicon layer.

According to the present invention, since the CVD layer to fill the isolation trench is a polycrystalline silicon layer, filling performance is improved compared with other CVD layers.

Also, in the method of manufacturing a semiconductor device according to the present invention, the CVD layer may be constituted of a same material as the dielectric layer.

According to the present invention, since the CVD layer to fill the isolation trench and the dielectric layer are of the same material, formation of a gap between the CVD layer and the dielectric layer can be prevented.

Also, in the method of manufacturing a semiconductor device according to the present invention, the dielectric layer may be a silicon oxide layer.

According to the present invention, the dielectric layer is a silicon oxide layer. Accordingly, even though the isolation trench is filled with a polycrystalline silicon layer, an entirety of the layers provided in the trench can remain insulated. Particularly, in case where the CVD layer filled in the isolation trench is a silicon oxide layer which is the same as the dielectric layer, the insulation performance is improved, which facilitates forming a finer isolation trench and thereby further micronizing the semiconductor device.

First Embodiment

A semiconductor device 100 according to a first embodiment will be described.

Figure 1B:
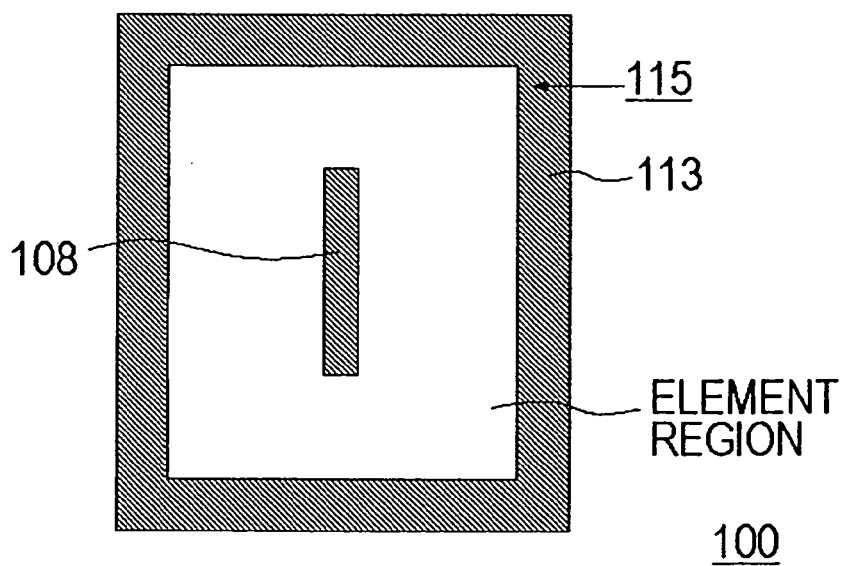

FIG. 1A is a schematic cross-sectional view showing a constitution of a semiconductor device 100 according to this embodiment. FIG. 1B is a schematic plan view showing a constitution of a semiconductor device 100 according to this embodiment. Here, a constitution of a circuit element such as a transistor and the like will be omitted from the drawing, along with a detailed description thereof.

As shown in FIG. 1A and FIG. 1B, the semiconductor device 100 has such a structure that a trench shield 115 (conductive layer) constituted of a conductive impurity-diffused polycrystalline silicon layer is provided over a trench isolation region 113 formed on a silicon substrate 101, via a gate insulating layer 106. Also, a gate electrode 108 is provided on a gate insulating layer 106, and the trench shield 115 and the gate electrode 108 are constituted of a portion of the same impurity-diffused polycrystalline silicon layer. An interlayer dielectric layer 117 is provided on the trench shield 115 and the gate electrode 108 for insulation between circuit elements and interconnects. On the interlayer dielectric layer 117, an interconnect (not shown in the drawings) is disposed for connection between circuit elements.

In other words, the semiconductor device 100 is constituted of the silicon substrate 101 (semiconductor substrate) including the trench isolation region 113 which is an isolation trench having a predetermined depth from an upper surface of the silicon substrate 101, the gate insulating layer 106, the gate electrode 108, the trench shield 115 and the interlayer dielectric layer 117.

Also, a dielectric layer 104 (first layer) such as a silicon oxide layer is provided in contact with an inner wall of the trench isolation region 113 in a form of a lining, and a filling polycrystalline silicon layer 105 (second layer) is provided in contact with an inner face of the dielectric layer 104 so as to fill the trench isolation region 113. The gate insulating layer 106 is formed so as to cover the silicon substrate 101, the dielectric layer 104, and the filling polycrystalline silicon layer 105. Now, as shown in FIG. 1A, since there is a gap between the dielectric layer 104 and the filling polycrystalline silicon layer 105, the gate insulating layer 106 has a recess where the gap exists. Also, the gate electrode 108 and the trench shield 115 are provided on the gate insulating layer 106. In other words, the trench shield 115 is located so as to cover the dielectric layer 104 and the filling polycrystalline silicon layer 105, which are selectively formed on the trench isolation region 113. In addition, the gate insulating layer 106 is provided over a region including a first region where the trench shield 115 is provided and a second region where the gate electrode 108 is provided, and the gate insulating layer 106 insulates the trench shield 115 from the dielectric layer 104 and filling polycrystalline silicon layer 105 to be later described, in the first region. In the second region, the gate insulating layer 106 insulates the gate electrode 108 from the silicon substrate 101 to be later described.

Since the trench shield 115 and the gate electrode 108 are formed but of the same layer, a height from the gate insulating layer 106 to an upper face of the trench shield 115 and a height from the gate insulating layer 106 to an upper face of the gate electrode 108 are substantially the same.

A method of manufacturing the semiconductor device 100 will now be described.

FIGS. 2A to 4C are schematic cross-sectional views showing a method of manufacturing a semiconductor device according to this embodiment.

Figure 2A:
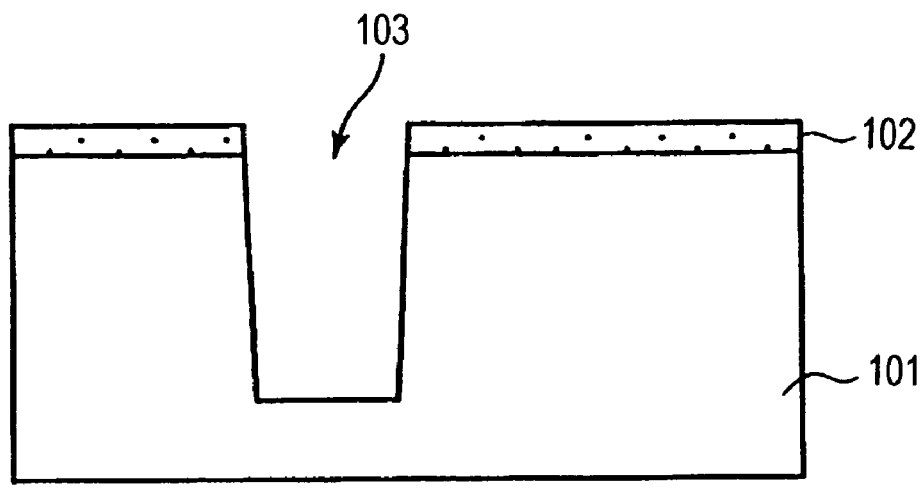
FIGS. 2A and 2B are schematic cross-sectional views showing a method of manufacturing a semiconductor device according to the embodiment.

Referring first to FIG. 2A, a mask oxide layer 102 having an opening of 0.5 to 2 μm in width is formed in a thickness of 100 to 600 nm on the silicon substrate 101. Then an anisotropic etching is performed on the silicon substrate 101 utilizing the mask oxide layer 102 as an etching mask, so that a trench 103 of 1 to 5 μm in depth is formed on the silicon substrate 101. The trench 103 is to serve as an isolation trench.

Figure 2B:
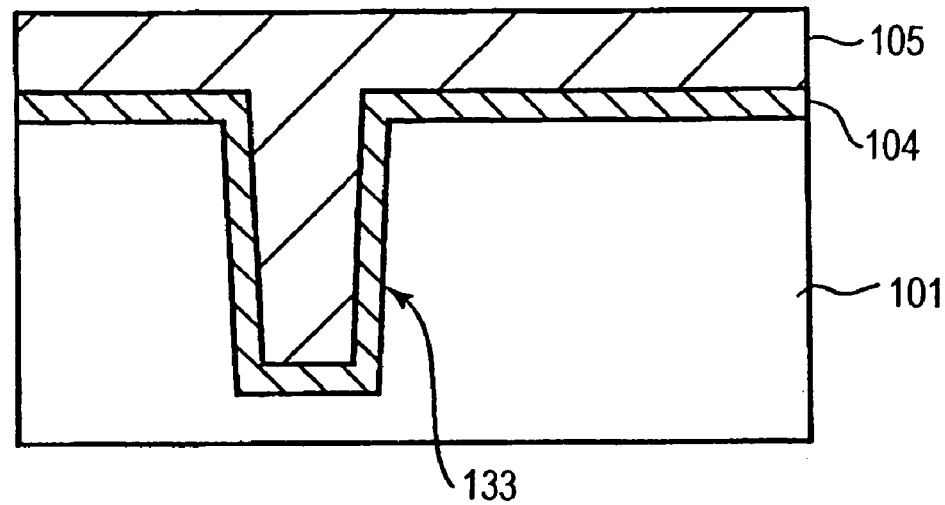

Referring to FIG. 2B, the mask oxide layer 102 is removed, and a silicon oxide layer is formed as the dielectric layer 104 in a thickness of 100 to 800 nm over the silicon substrate 101 and an inner wall of the trench 103, for example by a thermal oxidation process. Then a polycrystalline silicon layer is formed in a thickness of 150 to 1500 nm on the dielectric layer 104 by a CVD (Chemical Vapor Deposition) process, so that the trench 103 is filled with the polycrystalline silicon layer, to thereby constitute a trench isolation region 133. Here, a reason of forming the layer that is filled the trench 103 by a CVD process in this embodiment is that the CVD process permits efficiently forming a layer which is conformal to an underlying layer and also offers an excellent filling performance into a groove. The polycrystalline silicon layer that is filled in the trench 103 will be herein referred to as a filling polycrystalline silicon layer 105. Also, a layer formed by a CVD process will be herein referred to as a CVD layer.

Figure 3A:
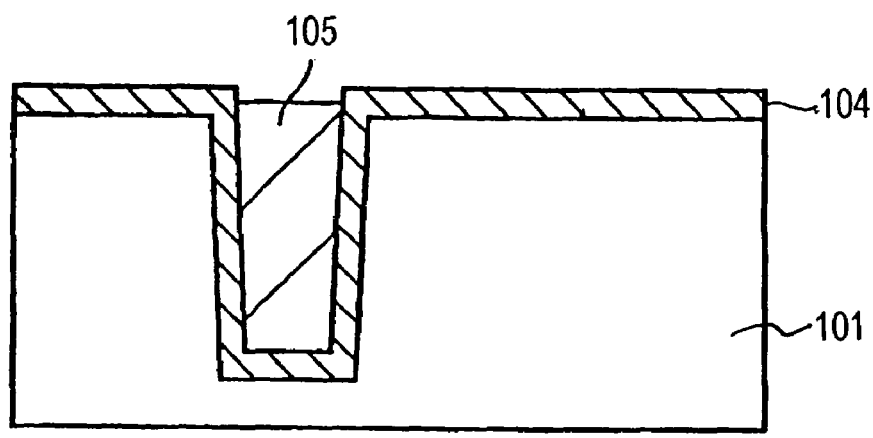
FIGS. 3A to 3C are schematic cross-sectional views showing a method of manufacturing a semiconductor device according to the embodiment.

Then as shown in FIG. 3A, an etch-back or a CMP (Chemical and Mechanical Polishing) process is performed so as to remove the filling polycrystalline silicon layer 105 except a portion formed in the trench isolation region 133.

Figure 3B:
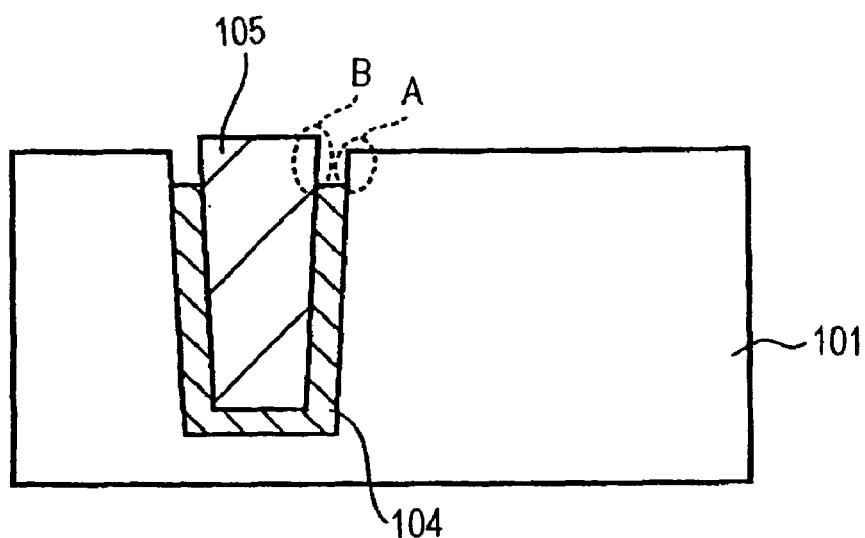

After the above, as shown in FIG. 3B, a wet etching is performed so as to remove the dielectric layer 104 except a portion formed in the trench 103.

Figure 3C:
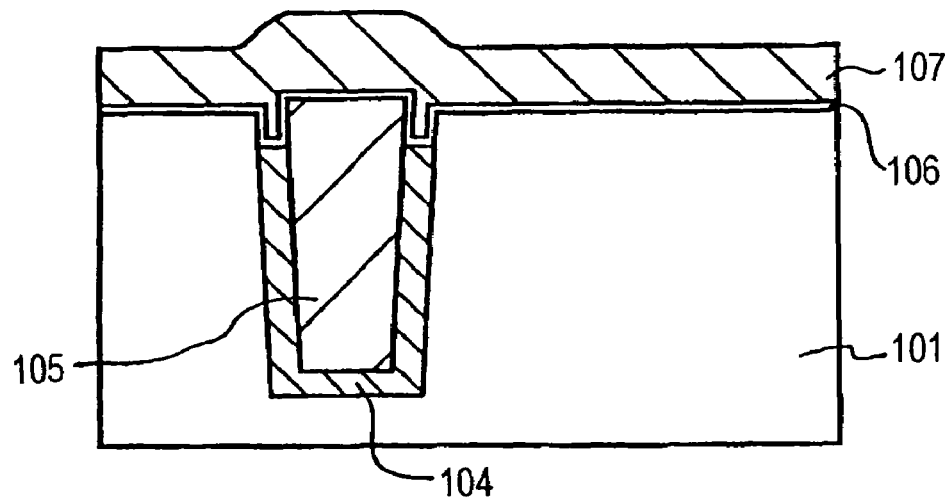

Referring now to FIG. 3C, the gate insulating layer 106 of a transistor is formed in a thickness of 3 to 30 nm on an upper surface of the silicon substrate 101 and the trench isolation region 133, for example by a CVD process. Then a polycrystalline silicon layer is formed in a thickness of 100 to 600 nm in contact with an upper surface of the gate insulating layer 106, for example by a CVD process. In order to form a gate electrode, a conductive impurity is diffused in the polycrystalline silicon layer, so as to constitute an impurity-diffused polycrystalline silicon layer 107.

Figure 4A:
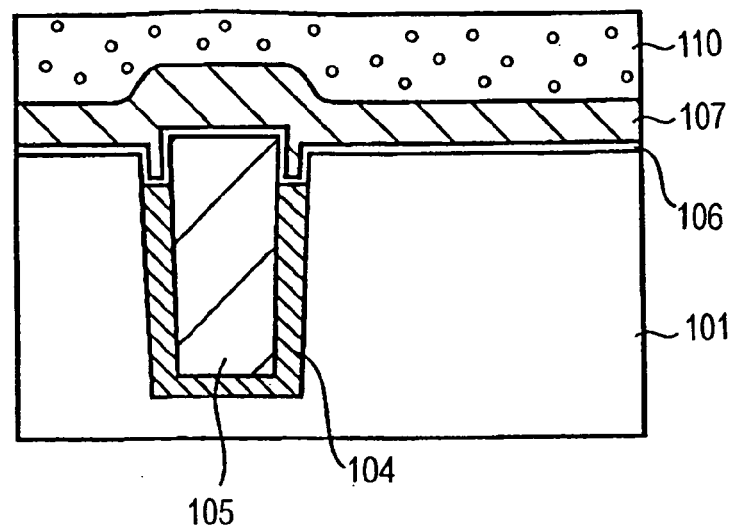
FIGS. 4A to 4C are schematic cross-sectional views showing a method of manufacturing a semiconductor device according to the embodiment.
Figure 4B:
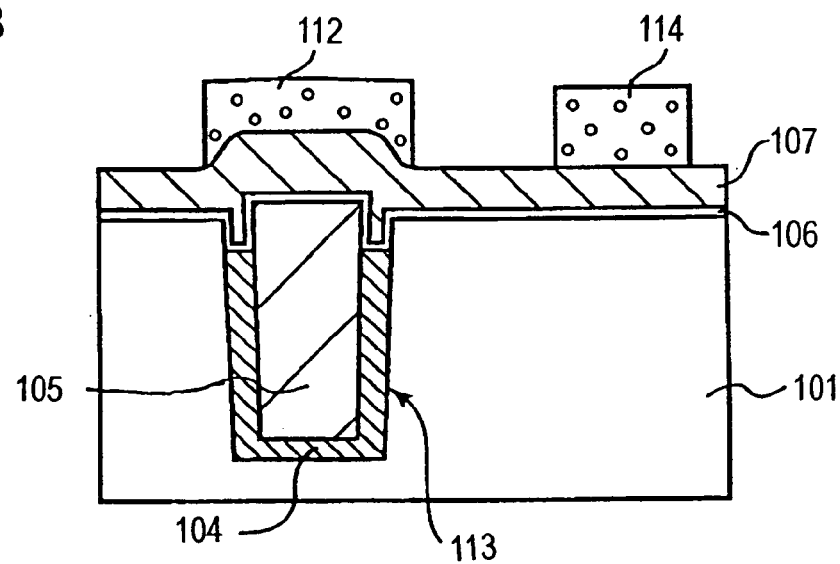

After the above, a resist 110 is formed on the impurity-diffused polycrystalline silicon layer 107 (FIG. 4A). Then an isolation region pattern 112 to cover the trench isolation region 113 and a gate electrode pattern 114 are formed by a known lithography technique, utilizing the resist 110 (FIG. 4B). Here, the isolation region pattern 112 is located so as to cover a portion of the gate insulating layer 106 provided along a recess designated as a gap A and a gap B in FIG. 3B, via the impurity-diffused polycrystalline silicon layer 107.

Figure 4C:
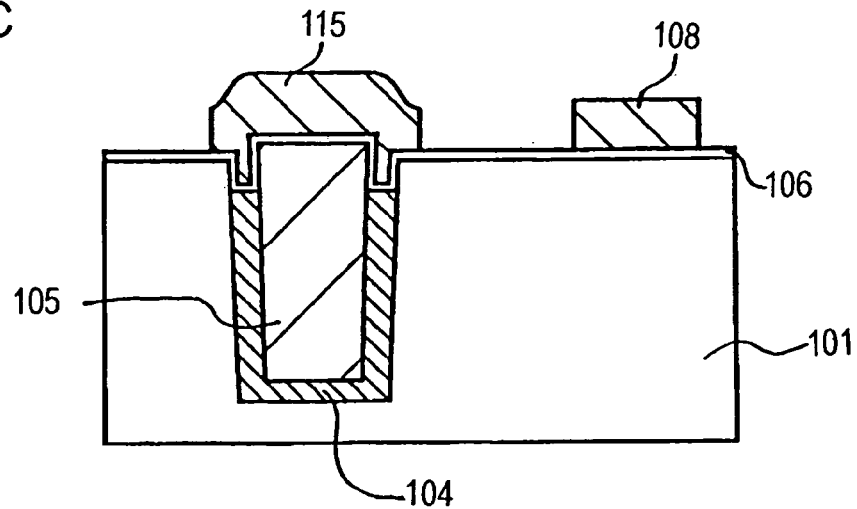

Then for example an anisotropic etching is performed on the isolation region pattern 112 and the gate electrode pattern 114 defined by the resist 110, to remove a portion of the impurity-diffused polycrystalline silicon layer 107 exposing a surface thereof. Now as shown in FIG. 4C, once the resist 110 is removed, the gate electrode 108 and the trench shield 115 which covers the trench isolation region 113 are formed at a time in the same single process, out of the same impurity-diffused polycrystalline silicon layer 107.

Then, an impurity diffusion is performed on the silicon substrate 101 to form a source electrode and a drain electrode of the transistor, and the interlayer dielectric layer 117 shown in FIG. 1A is formed, after which circuit elements such as a condenser and the like are formed, and then an interconnect is formed to achieve a connection between the circuit elements.

That is the process for obtaining the semiconductor device 100.

The advantage of this embodiment will now be described.

As described through the preceding passages, according to this embodiment a portion of the gate insulating layer 106 that is in contact with the dielectric layer 104 in the trench isolation region 113 is covered with the trench shield 115. Such constitution prevents the impurity-diffused polycrystalline silicon layer 107 on the dielectric layer 104 from being peeled off to turn into a waste when forming the gate electrode 108. Particularly in case of a semiconductor device 100 having a deep recess designated as the gap A and the gap B, where a waste is more prone to deposit in the recess, the advantage of this embodiment is prominently exhibited.

Also, since the trench isolation region 113 is intended for element isolation, the impurity-diffused polycrystalline silicon layer 107 constituting the trench shield 115 provided on the trench isolation region 113 as shown in FIG. 1B is electrically insulated from the surrounding circuit elements, and is therefore inhibited from causing undesired influence to an electrical characteristic or reliability of the semiconductor device.

Also, an area where the trench shield 115 makes contact with the gate insulating layer 106 only becomes slightly larger than an area of an upper surface of trench isolation region 113. Therefore, a reduced amount of a conductive layer can constitute the device, compared with a case where the conductive layer constituting the gate electrode is extended so as to cover the trench isolation region 113.

By the method of manufacturing a semiconductor device according to the embodiment, a pattern covering the trench isolation region 113 is constituted of the impurity-diffused polycrystalline silicon layer 107, which eliminates the possibility that an etching residue of the impurity-diffused polycrystalline silicon layer 107 is produced. This naturally prevents emergence of a waste from an etching residue in a subsequent process. Consequently, abnormality of a characteristic or degradation of reliability of the semiconductor device due to an etching residue can be prevented. Further, since the method eliminates the need to add a process to eliminate the gap formed in the trench isolation region as well as a process to remove an etching residue, the number of processes for manufacturing the semiconductor device is not increased.

Second Embodiment

In this embodiment the polycrystalline silicon layer filled in the trench 103 is substituted with a silicon oxide layer.

A method of manufacturing a semiconductor device according to the second embodiment will be described hereunder. Here, same constituents as the first embodiment are given an identical numeral, and a description thereof will be omitted.

Figure 5:
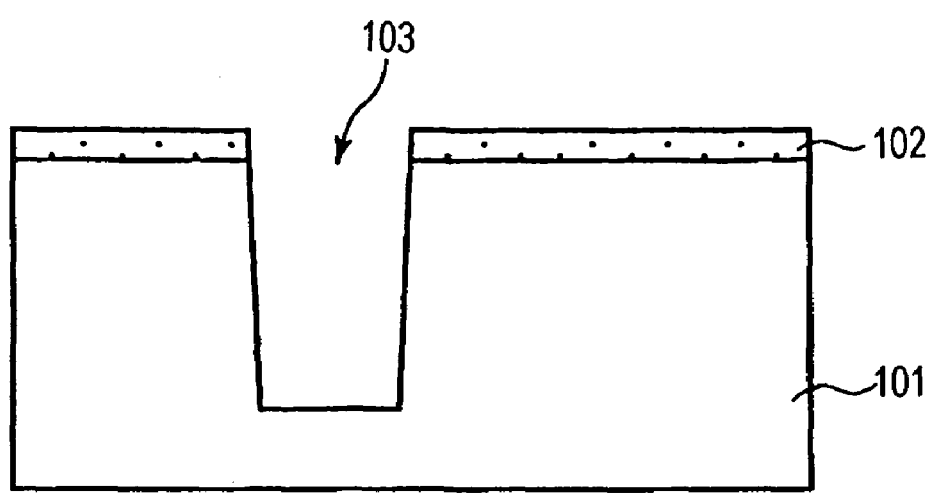
FIG. 5 is a schematic cross-sectional view showing a method of manufacturing a semiconductor device according to the embodiment.
Figure 6A:
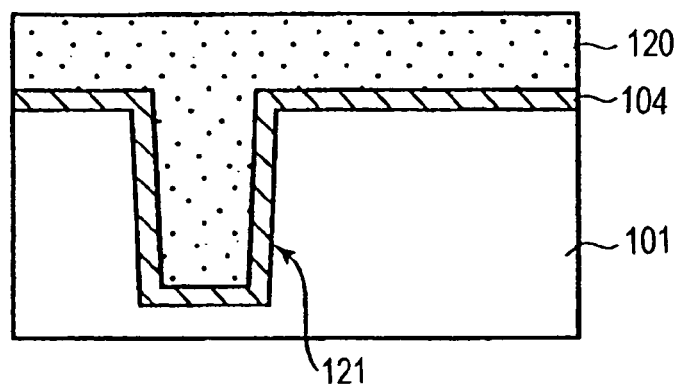
FIGS. 6A to 6D are schematic cross-sectional views showing a method of manufacturing a semiconductor device according to the embodiment.
Figure 6B:
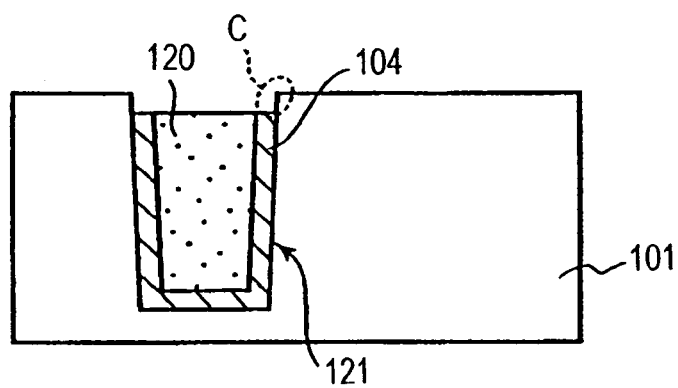
Figure 6C:
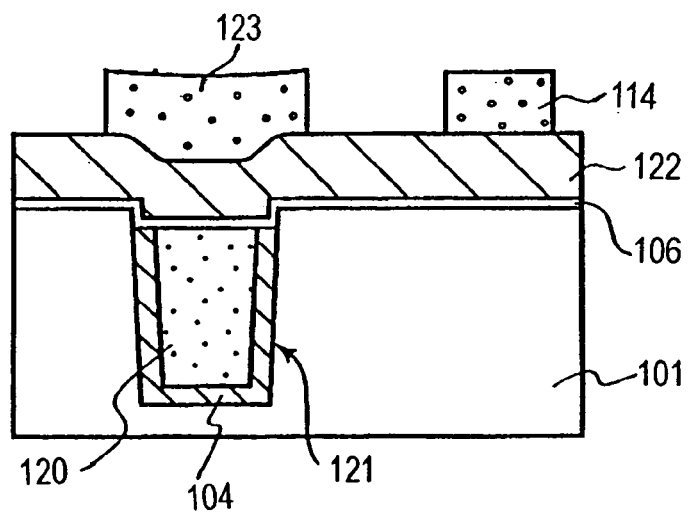
Figure 6D:
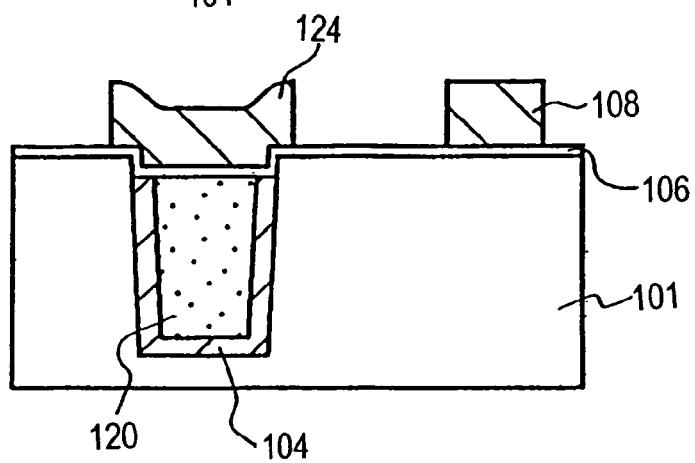
Figure 7A:
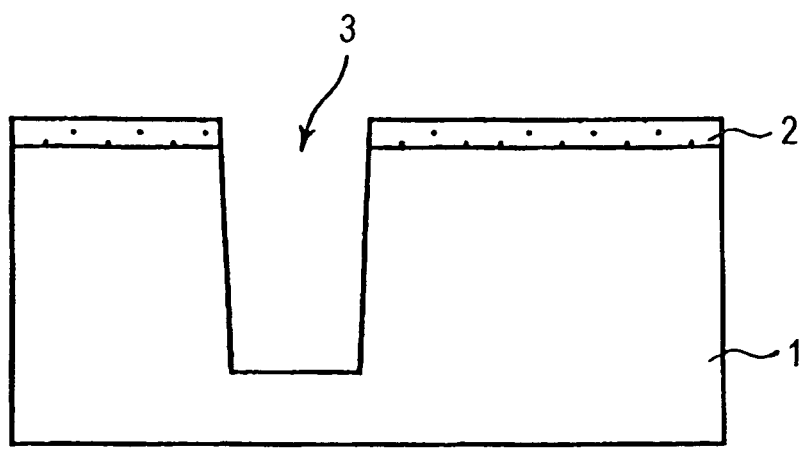
FIGS. 7A to 7C are schematic cross-sectional views showing a conventional method of manufacturing a semiconductor device.
Figure 7B:
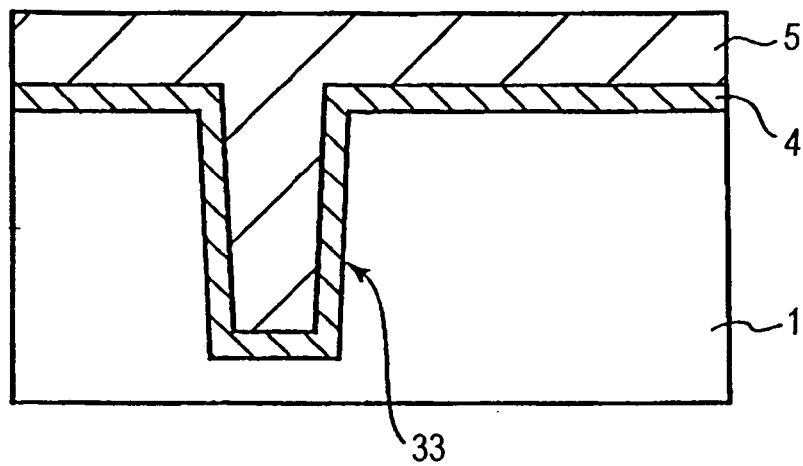
Figure 7C:
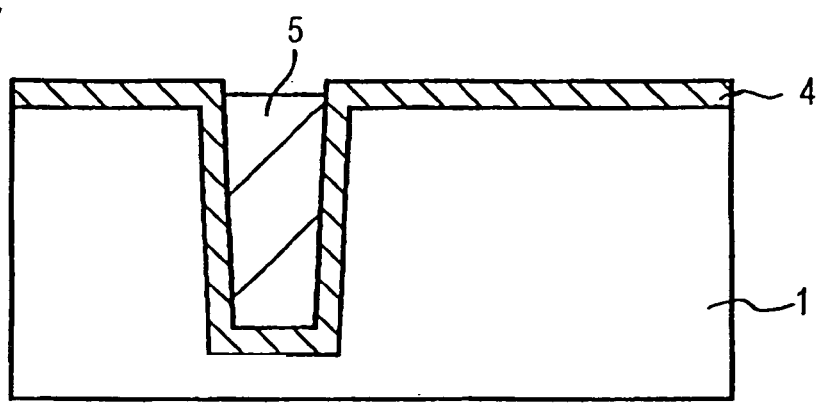
Figure 8A:
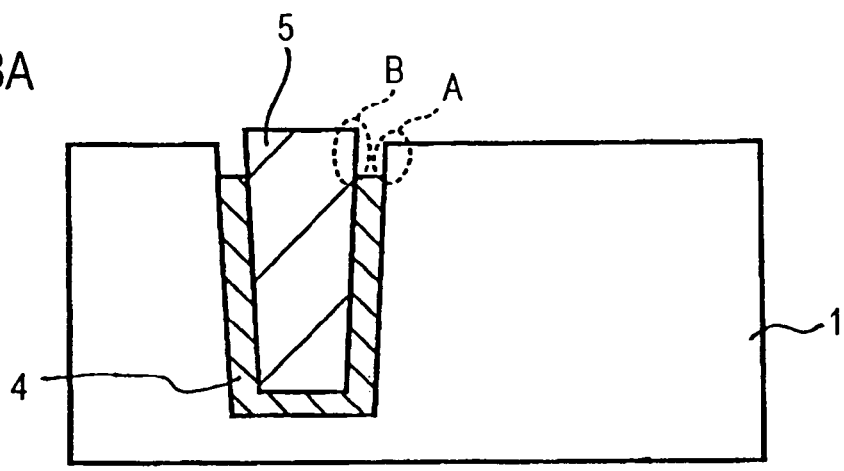
FIGS. 8A to 8C are schematic cross-sectional views showing a conventional method of manufacturing a semiconductor device.
Figure 8B:
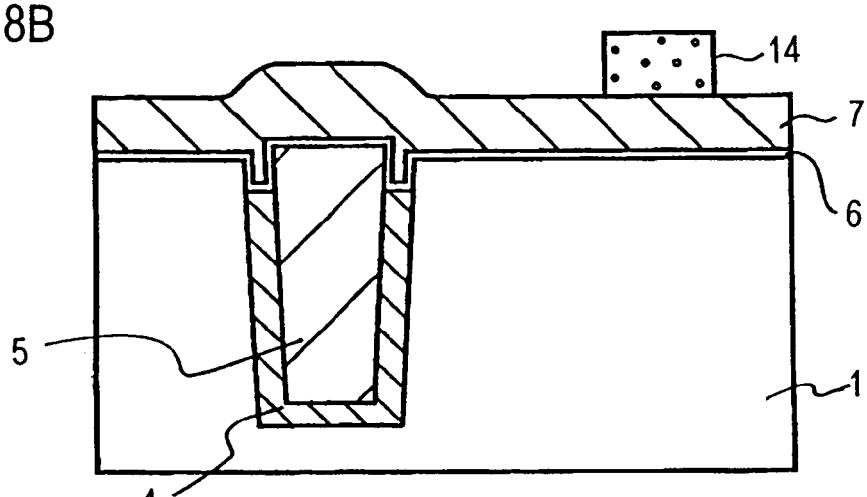
Figure 8C:
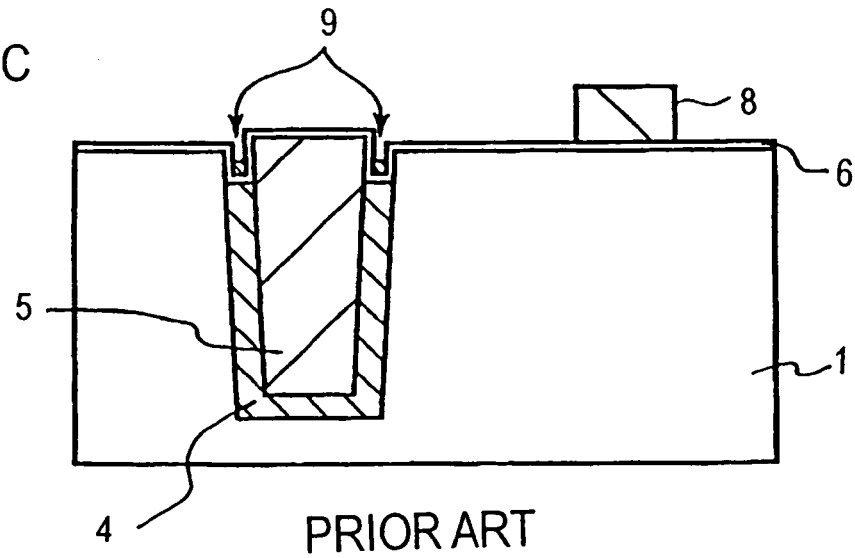

FIGS. 5 to 6D are schematic cross-sectional views showing a method of manufacturing a semiconductor device according to this embodiment.

Referring first to FIG. 5, the trench 103 of 1 to 5 μm in depth is formed on a surface of the silicon substrate 101, after which the mask oxide layer 102 is removed.

Referring then to FIG. 6A, a silicon oxide layer is formed as the dielectric layer 104 in a thickness of 100 to 800 nm over an upper surface of the silicon substrate 101 and an inner wall of the trench 103, for example by a thermal oxidation process. Then a silicon oxide layer 120 is formed in a thickness of 150 to 1500 nm on the dielectric layer 104 for example by a CVD process, so that the trench 103 is filled with the silicon oxide layer 120, to thereby constitute a trench isolation region 121.

Now referring to FIG. 6B, a wet etching is performed so as to remove the silicon oxide layer 120 located on the upper surface of the silicon substrate 101 and the dielectric layer 104. At this stage, an upper face of the silicon oxide layer 120 and dielectric layer 104 in the trench isolation region 121 becomes lower than the upper surface of the silicon substrate 101 because of an over etching, thereby forming a gap C.

When the gate insulating layer 106 is formed in a thickness of 3 to 30 nm, the gap C formed between the trench isolation region 121 and the silicon substrate 101 is reproduced in a shape of the gate insulating layer 106. Then after forming an impurity-diffused polycrystalline silicon layer 122 in a thickness of 100 to 600 nm so as to contact an upper surface of the gate insulating layer 106, an isolation region pattern 123 and the gate electrode pattern 114 are formed by a known lithography technique utilizing a resist (FIG. 6C). Here, as shown in FIG. 6C, the isolation region pattern 123 is located on the trench isolation region 121.

Then an anisotropic etching is performed on the resist to remove a portion of the impurity-diffused polycrystalline silicon layer 122 exposing a surface thereof, after which the resist is removed, such that the gate electrode 108 and the trench shield 124 are formed (FIG. 6D).

That is the process for obtaining the semiconductor device 100.

The advantage of this embodiment will now be described.

As described above, according to this embodiment a portion of the gate insulating layer 106 that is in contact with the dielectric layer 104 in the trench isolation region 121 is covered with the trench shield 124. Such constitution prevents the impurity-diffused polycrystalline silicon layer 122 on the dielectric layer 104 from being peeled off to turn into a waste. Accordingly, the similar advantage as the first embodiment can be attained. Also, since the trench isolation region 121 is intended for element isolation, the impurity-diffused polycrystalline silicon layer 122 constituting the trench shield 124 provided on the trench isolation region 121 is electrically insulated from the surrounding circuit elements, and is therefore inhibited from causing undesired influence to a characteristic of the semiconductor device.

Also, the silicon oxide layer used to fill the trench 103 is somewhat inferior to the polycrystalline silicon layer in filling performance, however offers better insulation between layers. Therefore sufficient insulation is secured even in a finer isolation trench, which leads to further micronization of the semiconductor device.

Further, since the silicon oxide layer 120 and the gate electrode 104 in the trench 103 are of the same material, the etching on these two layers is performed at a same rate, therefore a gap is not produced between the silicon oxide layer 120 and the dielectric layer 104. Also, while a thermal oxidation process is employed to form the silicon oxide layer to serve as the dielectric 104, a CVD process may also be employed.

Furthermore, according to the first and the second embodiments, the trench shield 115 as well as trench shield 124 cover a portion of the gate insulating layer 106 that is in contact with the CVD layer filled in the trench isolation region 113 and the trench isolation region 121, respectively. Such constitution prevents emergence of an etching residue of the impurity-diffused polycrystalline silicon layer 107 on a portion of the gate insulating layer 106 on the filling polycrystalline silicon layer 105.

Although the embodiments of the present invention have been described referring to the accompanying drawings, it is to be understood that these embodiments are only exemplary and that various other constitutions may be employed.

For example, while a silicon oxide layer is employed to constitute the dielectric layer 104, a silicon nitride layer may also be employed. In case of employing a silicon nitride layer as the dielectric layer 104, a gap may be formed in the trench isolation region because of a difference of etching rate between the filling polycrystalline silicon layer 105 and the silicon oxide layer 120, however by carrying out the method of manufacturing according to the embodiments the foregoing advantages can equally be attained.

Also, while the impurity-diffused polycrystalline silicon layer 107 and the impurity-diffused polycrystalline silicon layer 122 are employed in the foregoing embodiments, other layers may be employed as long as it is a conductive layer. For example a metal layer such as a tungsten (W) layer may be employed, which may be formed by a sputtering process.

Further, another pattern for forming an interconnect may be employed as the pattern defined by a resist to cover the conductive layer, instead of the gate electrode pattern 114. Alternatively, the gate electrode pattern 114 may be omitted.

Further, while the filling polycrystalline silicon layer 105 is formed by a CVD process in the foregoing embodiment, other methods may be employed for this purpose.

Still further, while an anisotropic etching is performed on the resist to form the trench shield 124 and the gate electrode 108 in the foregoing embodiment, another method may be employed for selectively removing a portion of the impurity-diffused polycrystalline silicon layer 122 exposing a surface thereof.

Still further, while a wet etching is performed to remove the dielectric layer 104 except a portion formed in the trench 103 in the foregoing embodiment, another etching technique such as a dry etching may be employed for removing the dielectric layer 104.

It is apparent that the present invention is not limited to the above embodiment, that may be modified and changed without departing from the scope and spirit of the invention.

What is claimed is:

1. A method of manufacturing a semiconductor device, comprising:
    forming an isolation trench on a surface of a semiconductor substrate;
    forming a dielectric layer on said surface of said semiconductor substrate including said isolation trench;
    filling said isolation trench;
    removing said dielectric layer except a portion in said isolation trench;
    sequentially forming an insulating layer and a conductive layer which covers said portion of said dielectric layer within isolation trench;
    forming a resist defining a pattern which covers via said conductive layer a portion of said insulating layer which covers said dielectric layer; and
    performing an anisotropic etching on said resist to thereby remove a portion of said conductive layer exposing a surface of said semiconductor substrate;
    wherein said resist covers via said conductive layer a portion of said insulating layer in contact with said filling.

2. The method as recited in claim 1, further comprising:
    forming said insulating layer in contact with an upper surface of said dielectric layer, said filling and said semiconductor substrate; and
    forming said conductive layer in contact with an upper surface of said insulating layer.

3. The method as recited in claim 1, wherein said resist is provided with a pattern for forming a gate electrode of a transistor.

4. The method as recited in claim 1, wherein said filling is a polycrystalline silicon layer.

5. The method as recited in claim 1, wherein said filling is constituted of a same material as said dielectric layer.

6. The method as recited in claim 1, wherein said dielectric layer is a silicon oxide layer.

7. A method of manufacturing a semiconductor device, comprising:
    forming an isolation trench on an upper portion of a semiconductor substrate;
    forming a first layer in contact with an upper surface of said semiconductor substrate including an inner wall of said isolation trench;
    filling said isolation trench with a second layer;
    selectively removing said first layer except a portion in said isolation trench;
    forming an insulating layer so as to cover said first layer, said second layer and an upper surface of said semiconductor substrate;
    forming a conductive layer so as to cover an upper surface of said insulating layer;
    forming a resist defining a pattern which covers via said conductive layer a portion of said insulating layer in contact with said second layer and with said first layer; and
    selectively removing an exposed portion of said conductive layer, forming a conductive layer on top of said isolation trench and a gate electrode.

8. The method as recited in claim 7, wherein said second layer is a CVD layer.

9. The method as recited in claim 7, wherein a gap defined by side surfaces of said semiconductor substrate and said second layer and a top surface of said first layer in said trench is formed when said first layer is selectively removed; and said gap is filled with said insulating layer and said conductive layer.

10. A method of manufacturing a semiconductor device, comprising:

forming an isolation trench on a surface of a semiconductor substrate;

forming a dielectric layer on said surface of said semiconductor substrate including said isolation trench;

filling said isolation trench;

removing said dielectric layer except a portion in said isolation trench;

sequentially forming an insulating layer and a conductive layer which covers said portion of said dielectric layer within said isolation trench;

forming a resist defining a pattern which covers via said conductive layer a portion of said insulating layer which covers said dielectric layer; and performing an anisotropic etching on said resist to thereby remove a portion of said conductive layer exposing a surface of said semiconductor substrate;

wherein a portion of the remaining conductive material forms a trench shield which covers said dielectric layer.

* * * * *